US 6,602,769 B2

(12) United States Patent
Einthoven et al.

(10) Patent No.: US 6,602,769 B2
(45) Date of Patent: Aug. 5, 2003

(54) LOW-VOLTAGE PUNCH-THROUGH BI-DIRECTIONAL TRANSIENT-VOLTAGE SUPPRESSION DEVICES AND METHODS OF MAKING THE SAME

(75) Inventors: Willem G. Einthoven, Belle Mead, NJ (US); Lawrence LaTerza, Miller Place, NY (US); Gary Horsman, Macroom (IE); Jack Eng, Valley Stream, NY (US); Danny Garbis, So. Huntington, NY (US)

(73) Assignee: General Semiconductor, Inc., Melville, NY (US)

( * ) Notice: Subject to any disclaimer, the term of this patent is extended or adjusted under 35 U.S.C. 154(b) by 0 days.

(21) Appl. No.: 10/264,950

(22) Filed: Oct. 4, 2002

(65) Prior Publication Data

US 2003/0038340 A1 Feb. 27, 2003

Related U.S. Application Data

(62) Division of application No. 09/862,664, filed on May 22, 2001, now Pat. No. 6,489,660.

(51) Int. Cl.[7] .............................................. H02L 21/22
(52) U.S. Cl. ....................... 438/542; 438/549; 438/416; 438/478; 257/497
(58) Field of Search ................................ 438/400, 414, 438/416, 478, 542, 549; 257/497, 498

(56) References Cited

U.S. PATENT DOCUMENTS

| | | | |
|---|---|---|---|
| 4,027,324 A | 5/1977 | Yagi et al. ..................... 357/34 |
| 4,980,315 A | 12/1990 | Einthoven et al. .......... 437/141 |
| 5,166,769 A | 11/1992 | Einthoven et al. .......... 257/496 |
| 5,233,214 A | 8/1993 | Gorlach et al. ............. 257/469 |
| 5,760,450 A | 6/1998 | Hurkx et al. ................ 257/379 |
| 5,811,873 A | * 9/1998 | Soejima ...................... 257/655 |
| 5,880,511 A | 3/1999 | Yu et al. ..................... 257/497 |
| 5,977,611 A | * 11/1999 | Sittig et al. ................. 257/603 |
| 6,069,043 A | 5/2000 | Floyd et al. ................ 438/270 |

OTHER PUBLICATIONS

Ya–Chin King et al., "Punchthrough Transient Voltage Suppressor for Low–Voltage Electronics," IEEE Electron Device Letters, vol. 16, Jul. 1995, pp. 303–305.
"Preliminary Data, Low Volage TVS Diode Array," Semtech Corp., Copyright 1996, 4 pages.
"Protection at Low Voltages," Electronics Weekly, Nov. 1, 1995, 1 page.
Fairchild Semiconductor, P6KE6.8(C)A, Copyright 1998, Fairchild Semiconductor Corporation, 5 pages.

* cited by examiner

Primary Examiner—Michael S. Lebentritt
Assistant Examiner—Bradley Smith
(74) Attorney, Agent, or Firm—Mayer Fortkort & Williams, PC; David B. Bonham, Esq.

(57) ABSTRACT

A bi-directional transient voltage suppression device with symmetric current-voltage characteristics has a lower semiconductor layer of first conductivity type, an upper semiconductor layer of first conductivity type, and a middle semiconductor layer adjacent to and disposed between the lower and upper layers having a second opposite conductivity type, such that upper and lower p–n junctions are formed. The middle layer has a net doping concentration that is highest at a midpoint between the junctions. Furthermore, the doping profile along a line normal to the lower, middle and upper layers is such that, within the middle layer the doping profile on one side of a centerplane of the middle layer mirrors the doping profile on an opposite side. In addition, an integral of the net doping concentration of the middle layer taken over the distance between the junctions is such that breakdown, when it occurs, is punch through breakdown, rather than avalanche breakdown.

9 Claims, 8 Drawing Sheets

LOW-VOLTAGE PUNCH-THROUGH BI-DIRECTIONAL TRANSIENT-VOLTAGE SUPPRESSION DEVICES AND METHODS OF MAKING THE SAME

STATEMENT OF RELATED APPLICATIONS

This application is a division of U.S. Pat. No. 6,489,660 Ser. No. 09/862,664 entitled "Low-Voltage Punch-Through Bi-Directional Transient-Voltage Suppression Devices And Methods Of Making The Same" filed on May 22, 2001.

FIELD OF THE INVENTION

The present invention relates to semiconductor devices. More particularly, the present invention relates to low-voltage punch-through bi-directional transient-voltage suppression devices having symmetric current-voltage characteristics.

BACKGROUND OF THE INVENTION

Electronic circuits that are designed to operate at low supply voltages are common in the electronics industry. Current trends toward a reduction in circuit operating voltage dictate a corresponding reduction in the maximum voltage that the circuitry can withstand without incurring damage. Such damage can arise from overvoltage conditions caused by electrostatic discharge, inductively coupled spikes, or other transient conditions. Hence, demand presently exists for transient-voltage suppressors having low breakdown voltages, for example, voltages in the 3–6 volt range.

One traditional device for overvoltage protection is the reversed biased p+n+ Zener diode. These devices perform well at higher voltages, but run into problems, specifically large leakage currents and high capacitance, at low breakdown voltages. For example, as breakdown voltages are reduced from 12 volts to 6.8 volts, leakage currents for these devices dramatically increase from about 1 $\mu$A to about 1 mA.

In response to these problems, low-voltage punch-through transient-voltage suppressors have been developed. Specifically, as seen in U.S. Pat. No. 5,880,511 to Semtech Corporation, the entire disclosure of which is hereby incorporated by reference, a transient suppressor device is described which comprises a n+p–p+n+ punch-through diode. Such devices can have low breakdown voltages, while having leakage and capacitance characteristics superior to those of certain prior-art transient suppressors. In contrast to, for example, Zener diodes, which provide overvoltage protection based on avalanche breakdown (i.e., breakdown caused by impact ionization that leads to carrier multiplication), these devices provide overvoltage protection as a result of punch-through. (Punch-through can be readily illustrated with reference to a transistor. For a transistor, punch-through occurs when a depletion region becomes as wide as the base of the transistor. Typically, punch-through occurs in a bipolar transistor where the depletion region of the collector junction of the transistor reaches the emitter junction on the opposite side of the base layer at voltages below the avalanche breakdown voltage of the collector junction.) The n+p–p+n+ devices of U.S. Pat. No. 5,880,511 are also claimed to be superior to other transient-voltage suppression devices, specifically n+pn+ uniform-base punch-through devices, which are claimed to suffer from poor clamping characteristics at high currents. Unfortunately, n+p–p+n+ devices, such as those described in U.S. Pat. No. 5,880,511 have current-voltage characteristics that are not symmetric. As a result, in order to make bi-directional transient-voltage suppressors, Semtech proposes a circuit of two of their transient-voltage suppressors in anti-parallel. Obviously, this arrangement adds expense in that it requires more than one device to achieve its intended function.

SUMMARY OF THE INVENTION

According to an embodiment of the invention, a bi-directional transient voltage suppression device with symmetric current-voltage characteristics is provided. The device comprises: (a) a lower semiconductor layer of first conductivity type; (b) an upper semiconductor layer of first conductivity type; and (c) a middle semiconductor layer adjacent to and disposed between the lower and upper layers. In this device, the middle layer has a second conductivity type opposite the first conductivity type, such that upper and lower p–n junctions are formed. Moreover, the middle layer has a net doping concentration that is highest at a midpoint between the junctions. Furthermore, the doping profile along a line normal to the lower, middle and upper layers is such that, within the lower, middle and upper layers, the doping profile on one side of a centerplane of the middle layer mirrors the doping profile on an opposite side of the centerplane. In addition, an integral of the net doping concentration of the middle layer taken over the distance between the junctions is such that breakdown, when it occurs, is punch through breakdown, rather than avalanche breakdown.

Preferably, the first conductivity type is p-type conductivity and the second conductivity type is n-type conductivity. Phosphorous is preferably used as an n-type dopant, and boron is used as a p-type dopant. More preferably, the bi-directional transient voltage suppression device comprises a p++ semiconductor substrate, a first epitaxial p+ layer deposited on the p++ substrate, an epitaxial n layer deposited on the first epitaxial p+ layer, and a second epitaxial p+ layer deposited on the epitaxial n layer. A p++ ohmic contact is typically formed at an upper surface of the second epitaxial p+ layer.

It is also preferred that the peak net doping concentration of each of the first and second epitaxial p+ layers ranges from 5 to 20 times the peak net doping concentration of the epitaxial n layer. Preferably, the peak net doping concentration of the epitaxial n layer ranges from $2\times10^{16}$ cm$^{-3}$ to $2\times10^{17}$ cm$^{-3}$, and the peak net doping concentration of the first and second epitaxial p+ layers range from $2\times10^{17}$ cm$^{-3}$ to $2\times10^{18}$ cm$^{-3}$. The integral of the middle layer net doping concentration taken over the distance between the junctions preferably ranges from $2\times10^{12}$ to $1\times10^{13}$ cm$^{-2}$. The preferred distance between the upper and lower junctions ranges from 0.2 to 1.5 microns.

The first and second epitaxial p+ layers are preferably sufficiently thick to more evenly distribute electrical current throughout the device. It is also preferred that the minority lifetime, punch through breakdown voltage, and theoretical avalanche breakdown voltage be selected so as to produce a Vceo (i.e., collector-emitter voltage, open base) having negative dynamic resistance that compensates for at least a portion of the positive dynamic resistance of the device in the on state.

In contrast to the above, in certain embodiments of the invention, the first conductivity type is n-type conductivity and the second conductivity type is p-type conductivity. Within these embodiments, the bi-directional transient voltage suppression device preferably comprises an n++ substrate, a first epitaxial n+ layer deposited on the n++ substrate, an epitaxial p layer deposited on the first epitaxial n+ layer, and a second epitaxial n+ layer deposited on the epitaxial p layer.

According to further embodiment of the invention, a method of making a bi-directional transient voltage suppression device is provided. The method comprises the following: (a) providing a semiconductor substrate of a first conductivity type; (b) depositing a lower epitaxial layer of the first conductivity type on the substrate; (c) depositing a middle epitaxial layer having a second conductivity type opposite the first conductivity type on the lower epitaxial layer, such that the lower layer and the middle layer form a lower p–n junction; (d) depositing an upper epitaxial layer of the first conductivity type on the middle epitaxial layer, such that the middle layer and the upper layer form an upper p–n junction; and (e) heating the substrate, the lower epitaxial layer, the middle epitaxial layer and the upper epitaxial layer. The above procedures are conducted such that: (a) the middle layer is provided with a net carrier concentration that is highest at a midpoint between the junctions, (b) a doping profile along a line normal to the lower, middle and upper epitaxial layers is established in which, within the lower, middle and upper layers, the doping profile on one side of a centerplane of the middle layer mirrors the doping profile one an opposite side of the centerplane, and (c) an integral of the middle layer net doping concentration taken over the distance between the junctions is such that breakdown, when it occurs, is punch through breakdown, rather than avalanche breakdown.

Preferably, the n epitaxial layer is grown to a thickness ranging from 1 to 4 microns, with the distance between junctions ranging from 0.2 to 1.5 microns after heating. Moreover, the doping concentration of the upper p+ epitaxial layer upon deposition is preferably between 1% and 8% less than the doping of the lower p+ epitaxial layer upon deposition.

One advantage of the present invention is that a low-voltage bi-directional transient-voltage suppressor is provided that has a low leakage current.

A further advantage of the present invention is that a low-voltage bi-directional transient-voltage suppressor is provided that has a lower capacitance than the Zener transient-voltage suppression device with the same breakdown voltage.

Yet another advantage of the present invention is that a low-voltage bi-directional transient-voltage suppressor is provided which has symmetric current-voltage characteristics. This is in contrast to, for example, the n+p–p+n+ devices described in U.S. Pat. No. 5,880,511.

Yet another advantage of the present invention is that a low-voltage bi-directional transient-voltage suppressor is provided which has acceptable clamping characteristics at high currents. More specifically, as noted above, U.S. Pat. No. 5,880,511 claims that n+pn+ uniform-base punch-through devices suffer from poor clamping characteristics at high currents. A base with a uniform carrier concentration is indeed in danger of becoming intrinsic at temperatures that are lower than most other constructions. High temperature protection is important, for example, during power surges in which the region bordering the junction can rise by several hundred ° C. within milliseconds. A base with a high-doped portion and a low-doped portion will perform better than a uniformly doped base of intermediate doping concentration, because the high-doped portion will become intrinsic at a higher temperature. One approach is to put a high-doped portion on one side of the base, as proposed in U.S. Pat. No. 5,880,511. The devices of the present invention, however, take another approach by placing the high-doped portion in the center of the base. In this way, the device of the present invention does not give up current-voltage symmetry, while being able to provide a base with a peak doping concentration that is higher (and hence an intrinsic temperature that is higher) than that found in a uniform-base device.

Although a base with these characteristics is achieved with a single epitaxial layer in preferred embodiments of the invention, other options are available. For instance a base layer containing three epitaxial sub-layers, each with a homogeneous concentration, is contemplated. For example, the center base sub-layer of such a device could occupy approximately 10% of the width of the total base and have ten times the concentration of the outer base sub-layers, which would divide the rest of the base width equally.

Another advantage of the present invention is that low-voltage bi-directional transient-voltage suppressors are provided that offer protection against surface breakdown. In the punch-through devices of the present invention, this means ensuring that the depletion layer does not reach the opposing junction at the surface before reaching it in the bulk.

These and other embodiments and advantages of the present invention will become readily apparent to those of ordinary skill in the art upon review of the disclosure and claims to follow.

BRIEF DESCRIPTION OF THE DRAWINGS

In FIG. 4, acceptor (boron) concentration is indicated by diamonds, donor (phosphorous) concentration is indicated by squares, and net donor (donor-acceptor) concentration is indicated by triangles.

In FIG. 9A, the current scale is 2 mA/step. In FIG. 9B, the vertical (current) scale is expanded to 200 µA/step.

DETAILED DESCRIPTION OF PREFERRED EMBODIMENTS

Those of ordinary skill in the art will realize that the following description of the present invention is illustrative only and not in any way limiting. Other embodiments of the invention will readily suggest themselves to such skilled persons.

Figure 1:
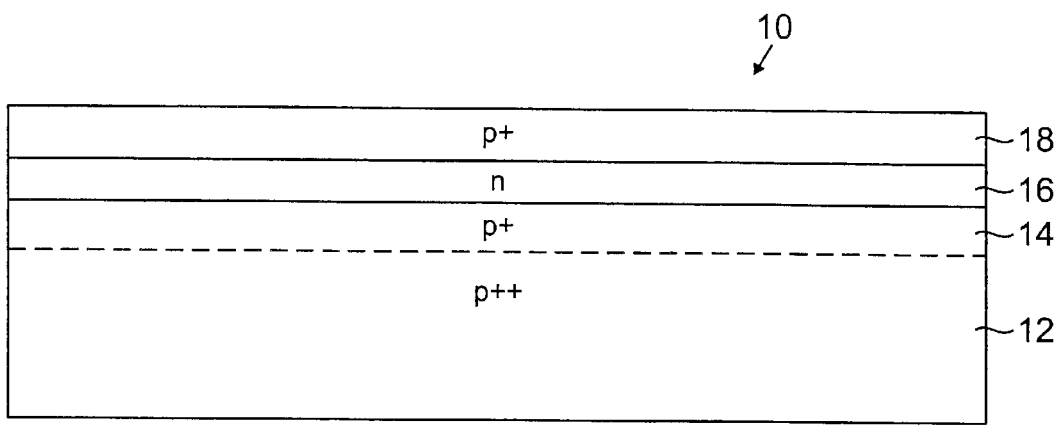
FIG. 1 is a cross-sectional view (not to scale) of a triple epitaxial structure for a low-voltage bi-directional transient-voltage suppressor device according to an embodiment of the present invention.

Referring now to FIG. 1, a p++p+np+ triple-epitaxial punch-through bi-directional transient-voltage suppressor 10 according to the present invention is shown schematically in cross sectional view. The device of the present invention is formed on a p++ semiconductor substrate 12. On this p++ substrate three regions are epitaxially grown, preferably in one continuous process. A first epitaxial p+ region 14 is initially formed on the upper surface of p++ region 12. An epitaxial n region 16 is then formed on the upper surface of p+ region 14, and a second epitaxial p+ region 18 is formed on the upper surface of n region 16. A p++ ohmic contact (not shown) is typically provided on the upper surface of p+ region 18. Such a device contains two junctions: (1) the junction formed at the interface of epitaxially grown p+ region 14 and epitaxially grown n region 16, and (2) the junction formed at the interface of epitaxially grown n region 16 and epitaxially grown p+ region 18.

Figure 2:
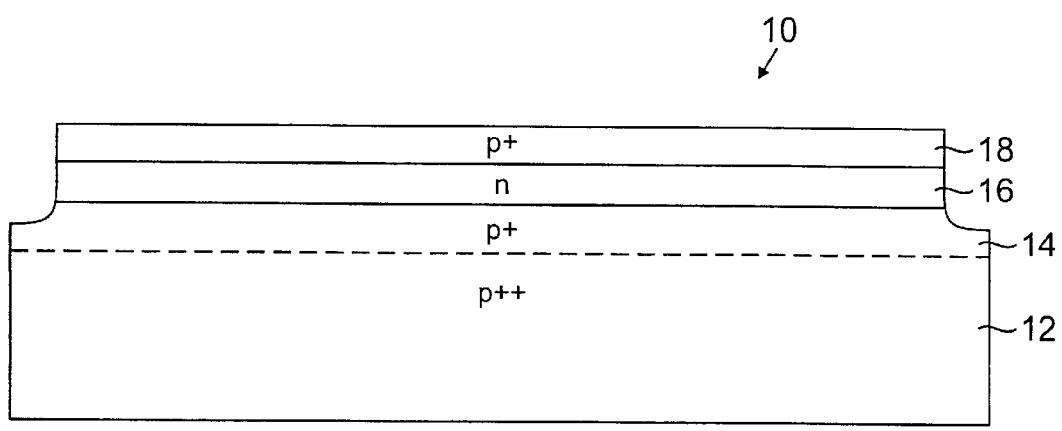
FIG. 2 is a cross-sectional view (not to scale) of the triple epitaxial structure according to FIG. 1 after formation of a mesa structure.

As shown in FIG. 2, the bi-directional transient-voltage suppressor 10 of FIG. 1 is typically provided with a mesa structure for junction termination.

A structure like that shown in FIGS. 1 and 2 is advantageous for several reasons. First, because the epitaxial layers can be grown in one continuous process, from the same raw materials, the p+ resistivity on both sides of the n layer can be matched to a much higher precision than would be the case if the first p+ layer would be replaced by a p+ substrate with, officially, the same resistivity. As a result, a much more symmetric breakdown voltage can be so established for both junctions with a triple epitaxial scheme. As discussed further below, experimental results have confirmed that the breakdown voltage is very symmetric for such a device, with less than a 2% difference being measured between forward and reverse breakdown voltage at 1.0 mA. In contrast, it is noted that the p–n junctions of the n+p–p+n+ device of U.S. Pat. No. 5,880,511 does not have this symmetry of the base and surrounding regions, and thus the device has asymmetric breakdown voltages.

An n++ n+pn+ triple-epitaxial punch-through bi-directional transient-voltage suppressor is also contemplated in connection with the present invention. However, pnp-type devices are preferred over npn-type devices for the following reasons: (1) An n base has a maximum resistivity as a function of temperature that occurs at a higher temperature than that observed for a p base having the same doping concentration. As a result, hot spot formation will set in at higher temperatures with an n base than with a p base. (2) The p layers outside the n base of the pnp-type device can be doped heavier than the n layers outside the p base of the npn-type device, while still having the same distributing resistance. (3) As discussed in more detail below, surface passivation with a grown oxide will only work for a pnp-type transient-voltage suppression device, not for the npn type device.

Referring again to FIG. 2, the breakdown voltage associated with the bottom grown p+ region 14 is frequently greater (typically about 2% greater) than that associated with the upper grown p+ region 18, largely due to diffusion that occurs from the p+ region 14 into the n region 16 during growth of the n region 16. Hence, if necessary, the doping level of the p+ region 18 can be adjusted to compensate for this effect. For example, this doping level can be diminished by about 2% to achieve a relatively good match between the breakdown voltages associated with the two p layers.

In general, to achieve desirable results, thermal treatment during further processing should be kept fixed from batch to batch. For example, further diffusion at high temperature results in a diminishing n region 16 width and lower punch-through breakdown. Hence, for a reproducible mass production process, the amount of diffusion should be kept constant within smaller tolerances than the amount of diffusion associated with standard diodes.

As previously noted, avalanche breakdown is caused by impact ionization, which leads to carrier multiplication. Punch through, on the other hand, is caused by the depletion region of one junction of the device of the present invention reaching the opposing forward-biased junction. For a given breakdown voltage, the depletion region generally associated with punch through is wider than that associated with avalanche breakdown. Under such circumstances, punch through is expected to have less capacitance, less tunneling, and hence less leakage current, than that associated with avalanche breakdown. Hence, for purposes of the present invention, it is essential to provide a device in which the theoretical avalanche breakdown voltage of the p–n junction (in this case, the avalanche breakdown voltage where the second p region is replaced with an n++ region) is greater than the voltage at which punch through occurs.

An avalanche breakdown voltage of 6.8 volts is frequently associated with a depletion layer thickness of about 0.2 microns. Moreover, a depletion layer thickness of 0.4 microns is associated with an avalanche breakdown voltage of about 12 volts, and as such is associated with low leakage currents. Using this thickness as a guideline, according to one preferred embodiment of the present invention, the n epitaxial region width is preferably about or greater than about 0.4 microns in thickness. (If this is not possible, for instance for very low voltages of about 2 V, the width should as large as possible under the circumstances.) The resistivity of this region is preferably about 0.3 to 0.08 ohm-cm. The circumstances should be selected so that avalanche breakdown voltage is greater than punch through breakdown voltage. Hence, avalanche breakdown is avoided.

Because epitaxial growth is more reproducible for thicker layers, the n epitaxial layer 16 is preferably grown to a greater thickness than that discussed above, more preferably 1 to 4 microns, and most preferably about 2 microns. Diffusion during the processing to follow (beginning with epitaxial growth of the second p+ region 18 and continuing with subsequent processing) will then narrow the thickness of the n region of epitaxial layer 16, and will decrease the doping on both sides of both p–n junctions (for example, compare FIGS. 4 and 5 discussed below). If desired, the wafer can be tested after the final phase of thermal processing. Should the breakdown voltage be too high, the wafers can be returned to a high-temperature environment for more diffusion. Preferred n region widths, after diffusion, are 0.2 to 1.5 microns, more preferably about 0.4 microns. The n-region is typically doped to about $2\times10^{16}$ to about $2\times10^{17}$ atoms/cm$^3$ during epitaxial growth. In general, it is preferred that the product of the net doping concentration of the n region multiplied by its thickness, and more preferably the integral of the net doping concentration over the thickness, after diffusion, be on the order of $2 \times 10^2$ to $1 \times 10^{13}$ atoms/cm$^2$.

To ensure net diffusion of p-type dopants from the p+ regions 14, 18 into the n region 16, which results in a narrower n region 16, the p+ layers are doped to higher levels than the n region 16. As a specific example, it is noted that boron (a p-type dopant) and phosphorous (an n-type dopant) have comparable diffusivities. Hence, a higher concentration of boron relative to phosphorous will lead to a narrowing of the n region 16 and vice versa. Due to variations in doping levels during processing, to ensure a reproducible narrowing of n region 16, the doping levels of the p+ regions 14, 18 are preferably about 10 times higher than those of n region 16.

On the other hand, because the p+ regions 14, 18 provide a distributed resistance that will oppose localized current concentrations, preventing, or at least delaying, hot spot formation, the resistivity of the p+ regions 14, 18 should not be too low (and hence the doping concentration should not be too high). As a result, it is preferred that the dopant concentration be selected to provide a resistivity in the p+ regions that ranges from about 0.02 to 0.2 ohm-cm. Typically, this corresponds to a doping level of $2 \times 10^{17}$ to about $2 \times 10^{18}$ atoms/cm$^3$ during epitaxial growth. The thickness of the two p+ regions can be adjusted to provide the desired overall resistance. Typical thicknesses are 10 to 50 microns.

Figure 3:
FIG. 3 is a plot of acceptor (boron) concentration (indicated by diamonds) and net donor concentration (indicated by squares) as a function of thickness for a structure in accordance with the present invention after growth of the epitaxial layers.
Figure 4:
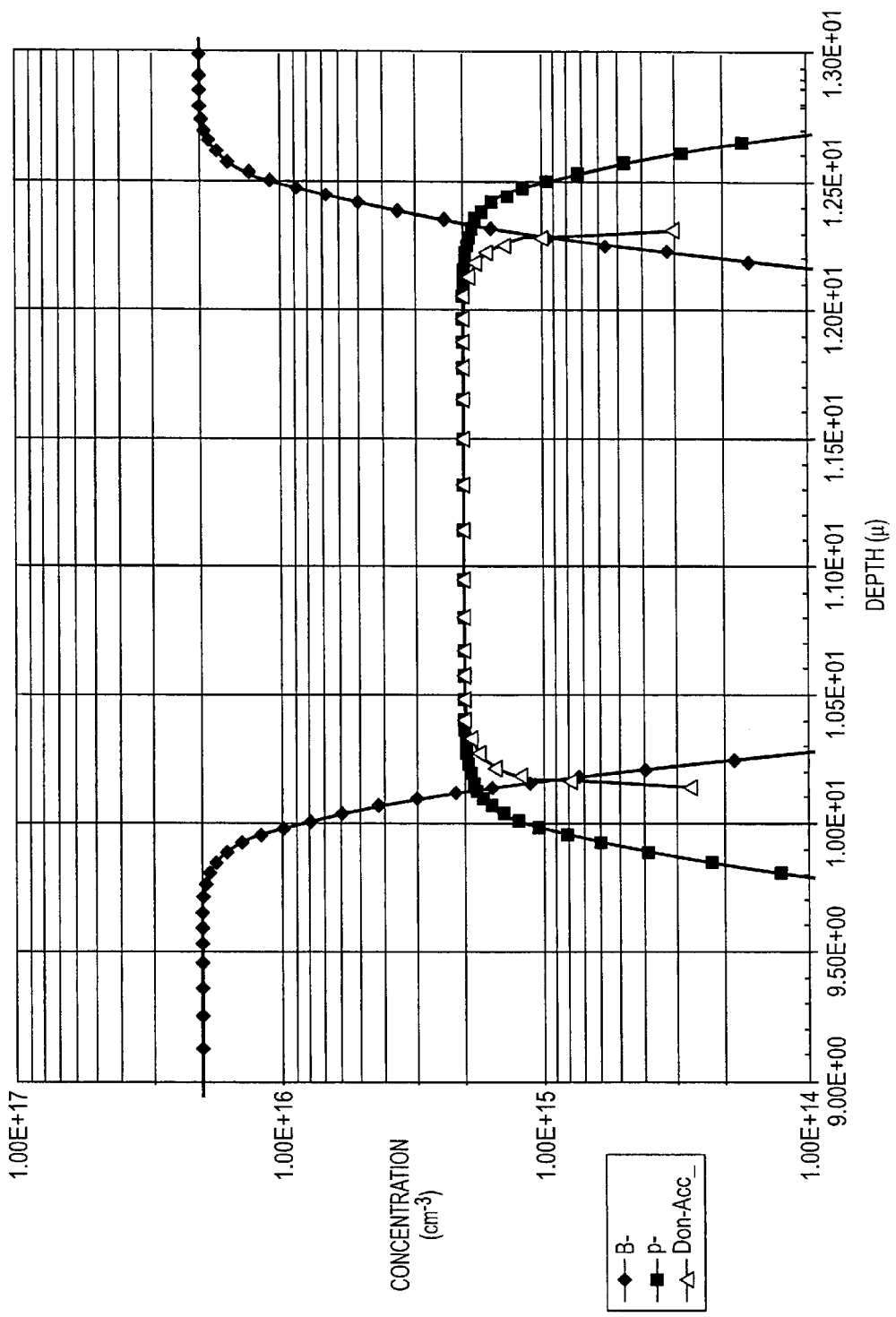
FIG. 4 is an expanded view (with the horizontal scale more than 10 times enlarged) of a portion of FIG. 3.
Figure 5:
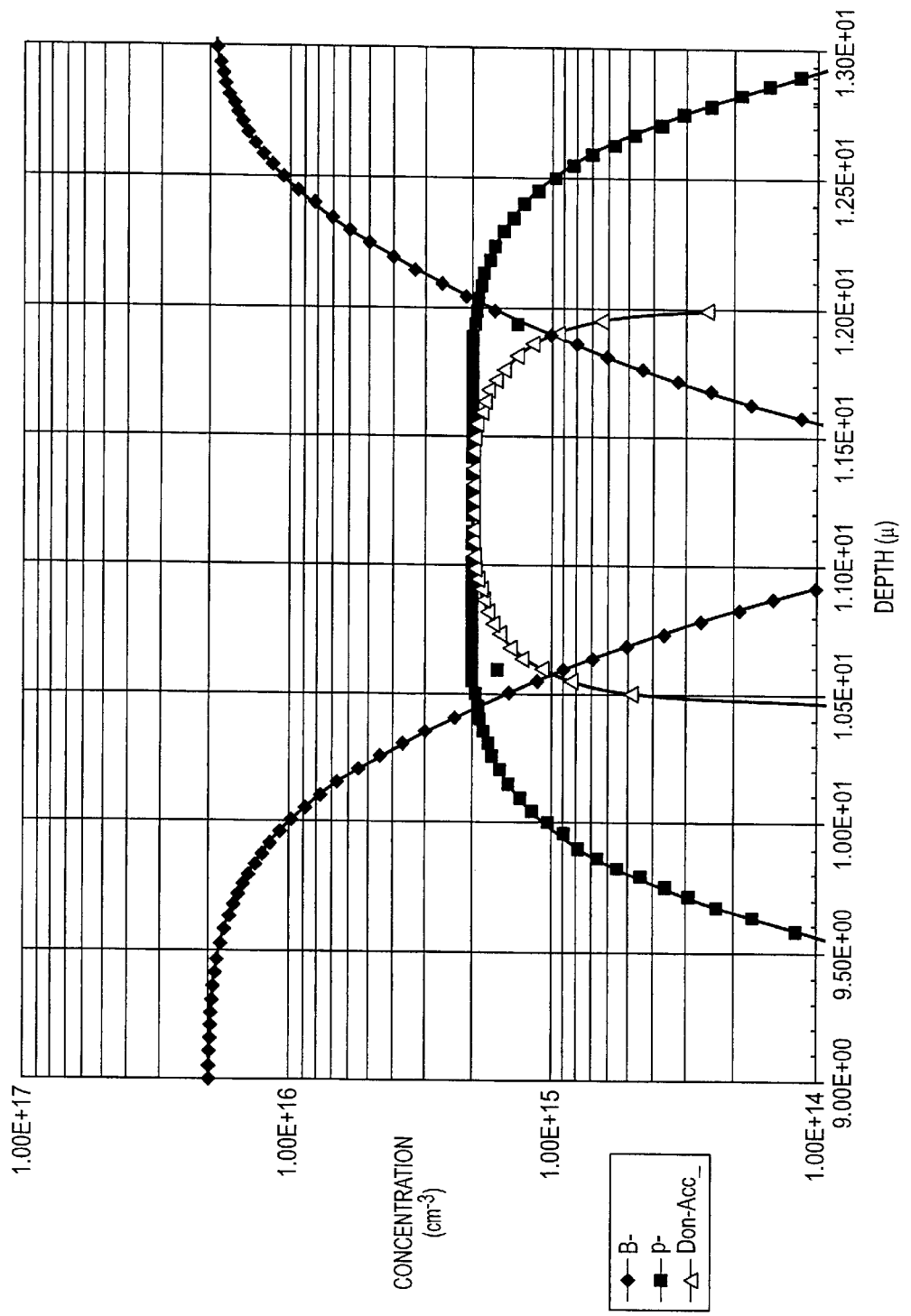
FIG. 5 illustrates acceptor (boron) concentration (indicated by diamonds), donor (phosphorous) concentration (indicated by squares), and net donor concentration (indicated by triangles) as a function of thickness for the device of FIG. 4 after a certain amount of diffusion of both the boron and the phosphorous atoms.

FIG. 3 is a plot of computer-simulated boron (acceptor) and phosphorus (donor) concentrations, as a function of thickness, for a three epitaxial layer p++p+np+ device according to an earlier test of the invention after epitaxial growth. This earlier test was performed before preferred numbers were established, so the concentrations for the n and p+ layers are lower in this figure than those of the presently preferred structure. These numbers, nonetheless, are sufficient to form working devices. The p++ region is on the right-hand side of the figure. Peak acceptor concentration in the p++ region is $2 \times 10^{19}$ cm$^{-3}$, peak acceptor concentration in the p+ regions is $2 \times 10^{16}$ cm$^{-3}$, and peak donor concentration in the n region is $2 \times 10^{15}$ cm$^{-3}$. FIG. 4 represents an enlargement of the plot of FIG. 3 in the vicinity of the n region and illustrates phosphorous (donor) concentrations, boron (acceptor) concentration and net donor (donor minus acceptor) concentration. FIG. 5 shows the same region after diffusion. Note that the base region (i.e., the region having a net donor concentration) is reduced in size from about 2 microns to about 1.6 microns. Moreover, regions adjacent the base region having a net donor concentration before diffusion are shown to have a net acceptor concentration after diffusion that is greater in magnitude than the net donor concentration before diffusion.

If preventative steps are not taken, punch through at the surface of the silicon in the mesa moat sidewall (surface breakdown) can occur before punch though in the bulk. This "surface", a ring not yet 1 micron wide, has an area orders of magnitude smaller than the area of the bulk of the device. Surface punch through results in a substantial dissipation of heat in the surface region, leading to device destruction at a low energy due to hot spot formation.

U.S. Pat. No. 4,980,315, the entire disclosure of which is hereby incorporated by reference, describes a process wherein an n layer having a relatively high concentration is diffused into a p wafer having a relatively low concentration. Next, the wafer is etched to yield a plurality of mesa semiconductor structures, each having a p–n junction intersecting a sidewall of the mesa structure. Then, a layer of oxide is grown on the sidewalls of the mesas, which oxide layer passivates the device. The oxidizing step curves the p–n junction toward the p layer in the vicinity of the oxide layer. Then, the p–n junction is diffused deeper into the p layer with a diffusion front, which tends to curve the p–n junction back toward the n layer in the vicinity of the oxide layer. This diffusion is carried out to such an extent as to compensate for the curvature caused by the oxidizing step and thereby substantially flatten the p–n junction. The patent teaches that a plurality of successive oxidation/diffusion steps can be undertaken to further flatten the junction adjacent the mesa sidewall. The resultant p–n junction has a greater avalanche breakdown voltage in the vicinity of the oxide layer due to the substantial flatness of the p–n junction and the reduction of both p and n concentration near the surface.

In contrast, punch through at the mesa sidewalls in the bi-directional transient-voltage suppression devices of the present invention can be prevented by the curvature of the p–n junction in the vicinity of the mesa sidewalls.

Specifically, oxidation results in the transformation of a thin layer of silicon on the sidewall of the mesa trench (also referred to herein as the "mesa moat") into silicon oxide. At the same time, there is a redistribution of the dopants adjacent to the oxide layer. In the case of boron and phosphorous, boron is redistributed such that it becomes lower in concentration in the vicinity of the oxide, while phosphorous experiences an increase in concentration in this region. As a result of this reduction of p-type dopant (boron) and this increase in n-type dopant (phosphorous), the p–n junction curves toward the p layer in the vicinity of the oxide layer and the width of the n region in this embodiment of the invention increases in the vicinity of the oxide, bending the junctions away for the n region and toward the adjacent p+ regions.

It will be clear to persons skilled in the art, that for an npn type of transient-voltage suppression device, after oxidation the bending of the junctions will be toward one another, practically assuring that punch-through breakdown will occur in the very narrow layer under the oxide at a lower voltage than in the bulk. Hence pnp-type punch-through transient-voltage suppression devices are preferred in this instance.

Figure 6:
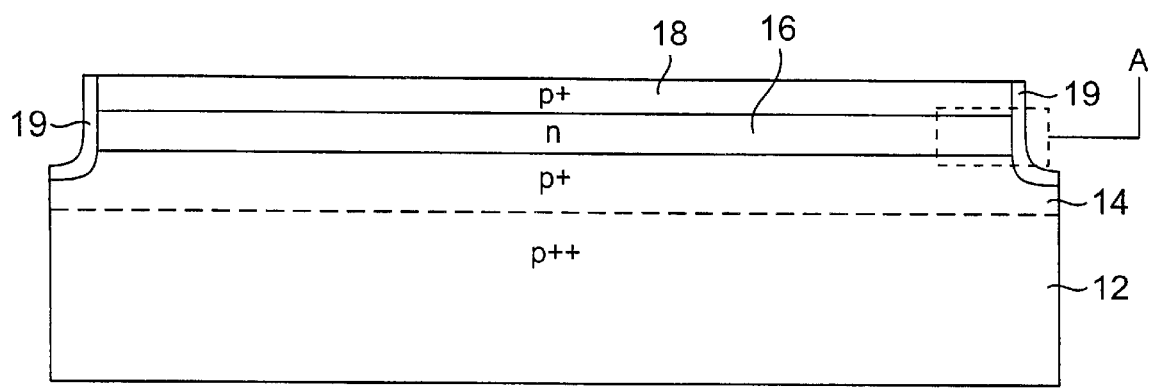
FIG. 6, like FIG. 2, is a cross-sectional view (not to scale) of a triple epitaxial structure, but with a silicon oxide sidewall provided, according to an embodiment of the present invention.
Figure 7:
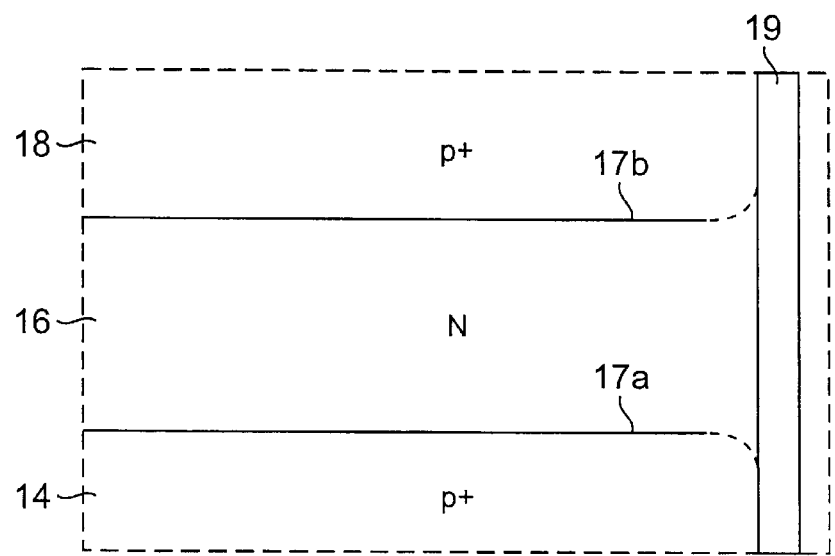
FIG. 7 is an expanded view (not to scale) of region A of FIG. 6, illustrating how the junctions curve away from one another.

Referring now to FIG. 6, a bi-directional transient-voltage suppression device of the present invention is shown having p++ semiconductor substrate 12, p+region 14, n region 16 and p+ region 18. A mesa structure is shown, the sides of which are covered with a layer of grown silicon oxide 19. FIG. 7 is an enlarged view of region "A" shown in FIG. 6. As can be seen from this figure, due to a decrease in p-type dopant (boron) concentration and an increase in n-type dopant (phosphorous) concentration at the oxide interface, p–n junctions 17a and 17b bend away from n region 16 as the silicon oxide layer 19 is approached.

Viewing the bi-directional transient-voltage suppression device of the present invention as a pnp transistor, it is seen that the base region (i.e., the n region) becomes wider at the silicon oxide interface. As discussed in more detail below, and as will become apparent to those of ordinary skill in the art, due to the wider base region, this portion of the transistor has a higher punch through voltage than the bulk region, protecting the device against surface breakdown. At punch-through breakdown voltage, current begins to flow through the breakdown region. Since breakdown occurs in the bulk, the breakdown region constitutes a large percentage (typically more than 98%) of the junction area. Because the breakdown current flows over a large area, heat is likewise dissipated over a large area.

Specifically, each p–n junction has an associated depletion region that widens with increasing reverse bias. Assuming avalanche breakdown does not occur, as voltage is increased, the depletion region under reverse bias reaches further and further into the n region until the p–n junction at the other side of the n region is reached. At this point, a current path is provided between the first and second p+ regions and punch through occurs. Near the silicon oxide interface, the p–n junctions curve away from one another. As a result, the depletion region near the oxide layer interface is still some distance away from the opposing junction (which curves away from the depletion region) at the point where the depletion region in the bulk reaches the opposing junction. In this way, punch through occurs in the bulk, rather than at the surface.

One result of the increase in donor (phosphorous) doping just under the oxide layer is an increase in the slope of the electric field at this region. This has both an advantage and a disadvantage. The advantage is that this step will narrow the depletion layer even further, helping to prevent surface breakdown. The disadvantage is that higher fields can lead to avalanche breakdown. However, in the devices of the present invention, the small increase in the peak field at the surface caused by dopant redistribution typically will not cause difficulties, if the peak field at punch through is made sufficiently lower than the peak field at avalanche breakdown.

Nonetheless, in some instances, it may be desirable for the peak field at which punch through occurs to approach, as closely as possible, the peak field at which avalanche breakdown occurs, for example, so that the Vceo of the transistor, with its negative dynamic resistance, reduces the positive dynamic resistance of the device. For this and other reasons, it is possible that the sharpness of the curvature of the junction will increase the local peak electric field beyond a safe level. In such cases, however, a compensation diffusion step can be added, after oxidation, to flatten the curvature of the junction somewhat, for example, as is set forth in U.S. Pat. No. 4,980,315. During such a compensation diffusion step, the increased donor (phosphorous) concentration at the oxide layer will spread out. Nonetheless, since the total excess number of donor atoms near the oxide layer will remain roughly the same, the surface will continue to be protected from punch-through breakdown.

The bi-directional transient-voltage suppressors of the present invention can be manufactured using standard silicon wafer fabrication techniques. A typical process flow is shown below with reference to FIGS. 8A to 8C. Those of ordinary skill in the art will readily appreciate that the process flow disclosed herein is in no way meant to be restrictive as there are numerous alternative ways to create the bi-directional transient-voltage suppressors.

Figure 8A:
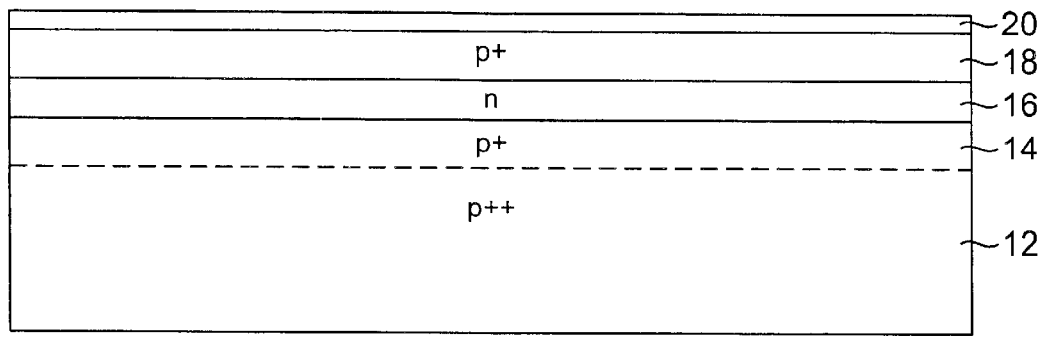
FIGS. 8A–8C are cross-sectional views (not to scale) illustrating a process for making a triple epitaxial device with a silicon oxide sidewall according to an embodiment of the present invention.

Referring now to FIG. 8A, the starting substrate material 12 for the bi-directional transient-voltage suppression device of the present invention is p-type (p++) silicon having a resistivity that is as low as possible, typically from 0.01 to 0.002 ohm-cm. A p-type (p+) epitaxial layer 14 having a doping concentration in the range of from about $2\times10^{17}$ to about $2\times10^{18}$ atoms/cm$^3$ (with lower concentrations being desired for higher breakdown voltages) is then grown to a thickness of between about 10 and about 50 $\mu$m (with greater thicknesses being desired for higher p+ doping, and, depending on the amount of distributing resistance needed for current distribution, for larger area devices) on substrate 12 using conventional epitaxial growth techniques. An n-type (n) epitaxial layer 16 having a doping concentration in the range of from about $2\times10^{16}$ to about $2\times10^{17}$ atoms/cm$^3$ (with lower concentration being desired for higher breakdown voltages) is then grown to a thickness of between about 1 and about 4 $\mu$m (with greater thicknesses being desired for higher breakdown voltages and longer diffusion times) on p-type epitaxial layer 14, also using conventional epitaxial growth techniques. Then, a p-type (p+) epitaxial layer 18 having the same doping concentration and thickness as layer 14 is grown on n-type epitaxial layer 16, again using conventional epitaxial growth techniques. These layers 14, 16 and 18 are preferably grown in one continuous process, without the wafers being exposed to air in between. A p-type (p++) region 20 is then formed in p-type epitaxial layer 18, either by deposition and diffusion, with a high enough surface concentration to form an ohmic contact, or by using other conventional methods such as aluminum alloying.

Figure 8B:
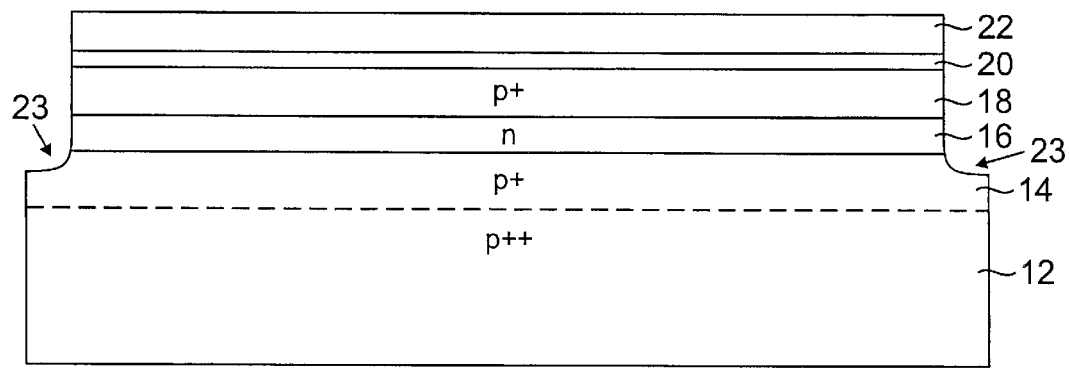

Referring now to FIG. 8B, a silicon nitride layer 22 is then deposited on the entire surface using conventional techniques, such as low-pressure chemical vapor deposition. A conventional photoresist masking and etching process is used to form a desired pattern in the silicon nitride layer 22. Moat trenches 23 are then formed using the patterned silicon nitride layer 22 as a mask using standard chemical etching techniques. The trenches 23 extend for a sufficient depth into the substrate (i.e., well beyond both junctions) to provide isolation and create a mesa structure. FIG. 8B shows the structure resulting after completing the silicon nitride masking and trench etching steps.

Figure 8C:
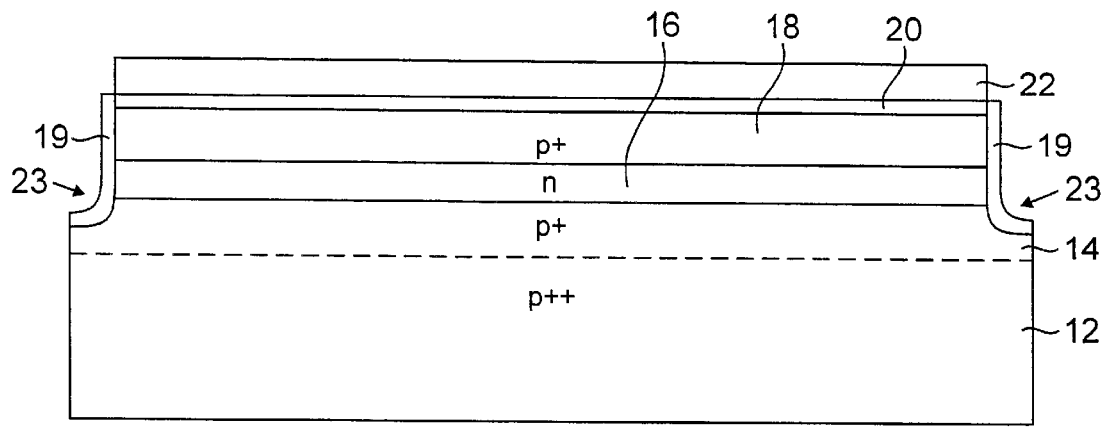

Referring now to FIG. 8C, according to an embodiment of the present invention, a thick, passifying silicon oxide layer 19, preferably about ½ micron thick is grown on the structure of FIG. 8B. Grown oxide layers are preferable to deposited layers because the dopants are re-distributed during oxide growth, because grown oxide layers are more dense, and because the steam (where wet oxidation is employed) cleans by burning or oxidizing a significant part of the submicroscopic dust on the surface.

By way of example, the wafer is preferably subjected to steam at 1100° C. for 2 hours to yield the grown oxide layer. It should be noted that the oxide layer grows only on the exposed silicon and does not grow on the silicon nitride layer 22. The result is illustrated in FIG. 8C, which shows a silicon dioxide layer 19 on the sidewalls of the mesa.

As noted above, during oxidation, a redistribution of dopants occurs in the vicinity of the oxide layer. As a specific example, the concentration of phosphorous adjacent the oxide increases, while the concentration of boron adjacent the oxide decreases. This results in a bending of the junctions away from one another and widening of the n+ region 16 in the area of the oxide.

Finally, if necessary, some additional diffusion can be performed to lower the breakdown voltage to the desired value.

Contact openings are then formed by removing the nitride layer 22, and contacts are formed with the p-type region 20 and p-type substrate 12 using conventional techniques (not shown).

EXAMPLE

Six wafers were made in a trial run according to the procedures to follow.

Three epitaxial layers were grown in one continuous process step. The wafers were not exposed to air and not cooled down during the continuous growth of the three layers. The p++ substrates had resistivities ranging from 0.005 to 0.002 ohm-cm. The first p+ epitaxial layer was 10 microns in thickness and had a resistivity of 0.5 ohm-cm. The n epitaxial layer was 2.5 microns in thickness and had a resistivity of 2.5 ohm-cm. The second p+ epitaxial layer had a thickness of 20 micron and a resistivity of 0.5 ohm-cm. After epitaxial layer growth, a boron deposition step was performed for 1 hour at 1100° C., with a slow temperature ramp up and ramp down. This deposition is performed on both sides of the wafer in a single step, creating ohmic contacts (p++regions).

A silicon nitride layer having a thickness of 200 nm was then deposited using conventional techniques.

A patterned photoresist layer was then applied to the structure forming a mesa mask (the mesa moat region is the region not covered by the photoresist). The mesa moat was then etched using an etching medium of HF, $HNO_3$ and acetic acid, as is known in the art.

The device was then subjected to steam oxidation for 1 hour at 1100° C., with a slow temperature ramp up and ramp down in a very clean furnace.

Subsequently, each wafer was subjected to a diffusion time ranging from 0 to 8 hours at 1100° C. to achieve a variety of desired breakdown voltages.

The nitride layer was then removed (for contact openings) in a plasma-etching step. The device was finished in a standard manner, including glassing, nickel plating, wafer testing, wafer sawing and assembly into individual devices.

Figure 9A:
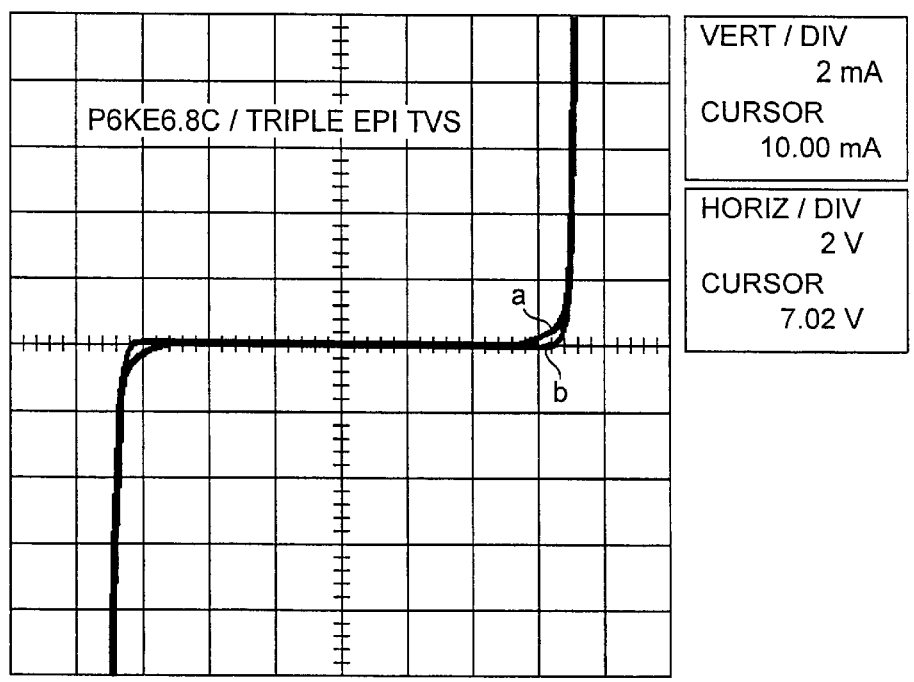
FIGS. 9A and 9B are current-voltage traces illustrating the bi-directional breakdown characteristics for a bi-directional transient-voltage suppression device of the present invention (curve b) and a commercially available bi-directional transient-voltage suppressor (curve a).
Figure 9B:
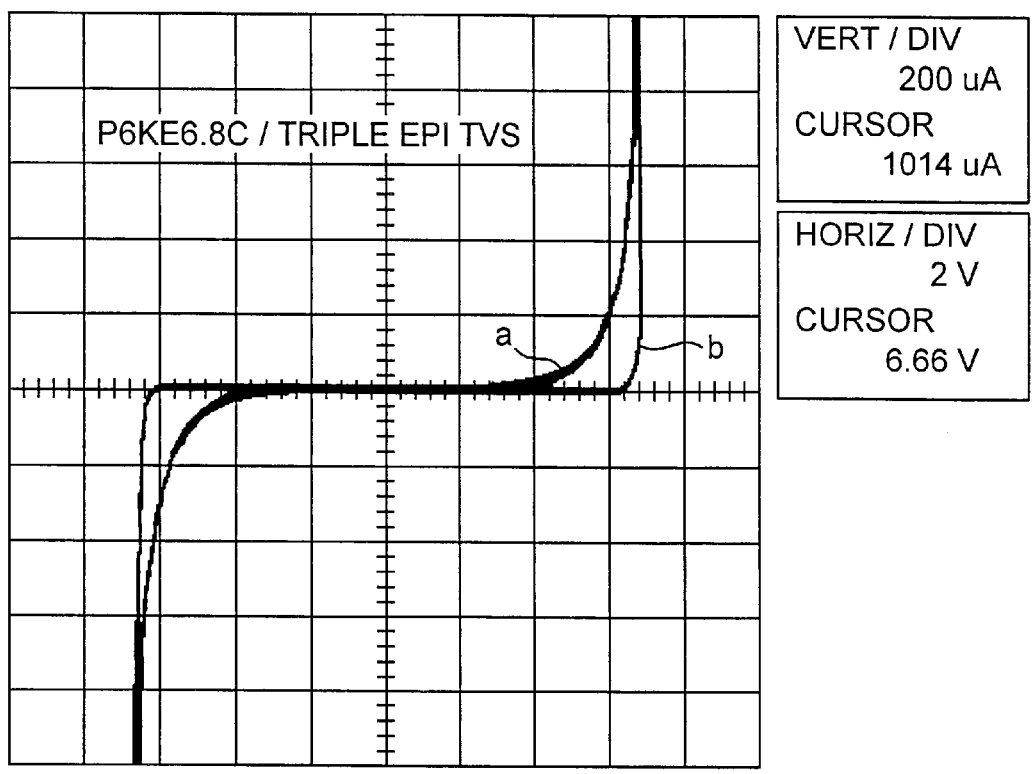

Two wafers subjected to relatively short diffusion times (i.e., on the order of 2 hours or less) produced bi-directional, triple epitaxial, transient-voltage suppression devices of high quality in the desired voltage range of 4 to 7V. Current-voltage traces illustrating the bi-directional breakdown characteristics of one of these devices, along with a standard P6KE6.8CA (General Semiconductor Corporation bi-directional transient-voltage suppressor) Zener device are shown in FIGS. 9A and 9B. The horizontal axes in these figures correspond to voltage and the vertical axes correspond to current. The (horizontal) voltage scale is at 2V per step. The (vertical) current scale is at 2 mA per step for FIG. 9A; and expanded ten times, to 200 uA per step for FIG. 9B.

In FIGS. 9A and 9B both the experimental device and the standard device have a breakdown voltage of 7.02 volts at 10 mA. However, curve b in these figures, which corresponds to the bi-directional transient-voltage suppression device of the present invention, has much sharper corners than curve a, which corresponds to the standard device. This effect can be seen more clearly in FIG. 9B, which has an expanded current scale. A sharper corner indicates lower leakage current as breakdown voltage is approached. For example, the current associated with curve a (the standard device) is 230 µA at 5.8 V, while the current associated with curve b (the triple epitaxial transient-voltage suppression device of the present invention) is only 0.8 µA at 5.8 V. Hence, at this voltage, which is more than 1 volt shy of breakdown, the leakage current of the standard device is nearly 300 times that of the bi-directional transient-voltage suppression device of the present invention.

Other bi-directional transient-voltage suppression devices from the same wafer, having breakdown voltages of 5.72 V and 6.26 V at 10 mA, were tested. Bi-directional transient-voltage suppression devices from another wafer, having breakdown voltages of 5.20 V, 5.83 V and 6.74 V at 10 mA, were also tested. Like the bi-directional transient-voltage suppression devices of FIGS. 9A and 9B, each of these devices has much sharper corners than that associated with the P6KE6.8CA device, which is indicative of lower leakage currents as breakdown voltage is approached.

While embodiments and examples of this invention have been shown and described, it will be apparent to those skilled in the art that many more modifications than mentioned above are possible without departing from the inventive concepts herein. The invention, therefore, is not to be restricted except in the spirit of the appended claims.

What is claimed is:

1. A method of making a bi-directional transient voltage suppression device comprising:

providing a semiconductor substrate of a first conductivity type;

depositing a lower epitaxial layer of said first conductivity type on said substrate;

depositing a middle epitaxial layer having a second conductivity type opposite said first conductivity type on the lower epitaxial layer, said lower layer and said middle layer forming a lower p–n junction;

depositing an upper epitaxial layer of said first conductivity type on said middle epitaxial layer, said middle layer and said upper layer forming an upper p–n junction; and heating said substrate, said lower epitaxial layer, said middle epitaxial layer and said upper epitaxial layer, such that: (a) said middle layer is provided with a net carrier concentration that is highest at a midpoint between said junctions, (b) a doping profile along a line normal to the lower, middle and upper epitaxial layers is formed, in which the doping profile on one side of a centerplane of said middle layer mirrors the doping profile one an opposite side of said centerplane within said middle layer and within at least a portion of said lower and upper layers, and (c) an integral of the net doping concentration of the middle layer taken over the distance between the junctions is such that breakdown, when it occurs, is punch through breakdown, rather than avalanche breakdown.

2. The method of claim 1, wherein said first conductivity type is p-type conductivity and said second conductivity type is n-type conductivity.

3. The method of claim 2, wherein said substrate is a p++ substrate, wherein said lower epitaxial layer is a p+ epitaxial layer, wherein said middle epitaxial layer is an n epitaxial layer, wherein said upper epitaxial layer is a p+ epitaxial layer, and wherein the peak net doping concentration of each of the lower and upper p+ epitaxial layers ranges from 5 to 20 times the peak net doping concentration of the n epitaxial layer.

4. The method of claim 3, wherein the peak net doping concentration of the n epitaxial layer ranges from $2 \times 10^{16}$ $cm^{-3}$ to $2 \times 10^{7}$ $cm^{-3}$.

5. The method of claim 3, wherein the n epitaxial layer is grown to a thickness ranging from 1 to 4 microns, and wherein the distance between junctions, after heating, ranges from 0.2 to 1.5 microns.

6. The method of claim 3, said integral ranges from $2 \times 10^{12}$ to $1 \times 10^{13}$ $cm^{-2}$.

7. The method of claim 3, wherein the doping concentration of the upper p+ epitaxial layer upon deposition is between 1% to 8% less than the doping of the lower p+ epitaxial layer upon deposition.

8. The method of claim 1, wherein said first conductivity type is n-type conductivity and said second conductivity type is p-type conductivity.

9. The method of claim 8, wherein said substrate is an n++ substrate, wherein said lower epitaxial layer is an n+ epitaxial layer, wherein said middle epitaxial layer is a p epitaxial layer, and wherein said upper epitaxial layer is an n+ epitaxial layer.

* * * * *

UNITED STATES PATENT AND TRADEMARK OFFICE
CERTIFICATE OF CORRECTION

PATENT NO. : 6,602,769 B2
DATED : August 5, 2003
INVENTOR(S) : Willem G. Einthoven It is certified that error appears in the above-identified patent and that said Letters Patent is hereby corrected as shown below:

Column 3,
Line 27, after "profile", change "one" to -- on --.

Column 5,
Line 52, after "An", change "n++ n+pn+" to -- n++n+pn+ --.

Column 8,
Line 36, after "away", change "for" to -- from --.

Column 12,
Line 37, after "profile", change "one" to -- on --.

Signed and Sealed this

Twenty-fourth Day of August, 2004

JON W. DUDAS
*Director of the United States Patent and Trademark Office*